US012735543B2

(12) United States Patent
Nishiguchi et al.

(10) Patent No.: US 12,735,543 B2
(45) Date of Patent: Sep. 15, 2026

(54) RESIN COMPOSITION AND PREPREG, FILM WITH RESIN, METAL FOIL WITH RESIN, METAL-CLAD LAMINATED PLATE, AND WIRING BOARD USING SAME

(71) Applicant: PANASONIC INTELLECTUAL PROPERTY MANAGEMENT CO., LTD., Osaka (JP)

(72) Inventors: Yasunori Nishiguchi, Osaka (JP); Hirosuke Saito, Osaka (JP); Taito Hieida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 19/117,891

(22) PCT Filed: Sep. 28, 2023

(86) PCT No.: PCT/JP2023/035397

§ 371 (c)(1),
(2) Date: Apr. 2, 2025

(87) PCT Pub. No.: WO2024/075629

PCT Pub. Date: Apr. 11, 2024

(65) Prior Publication Data

US 2026/0022220 A1 Jan. 22, 2026

(30) Foreign Application Priority Data

Oct. 3, 2022 (JP) ................................. 2022-159545

(51) Int. Cl.
*B32B 3/10* (2006.01)
*B32B 15/08* (2006.01)
*C08J 5/24* (2006.01)
*C08K 5/5313* (2006.01)
(Continued)

(52) U.S. Cl.
CPC ............... *C08J 5/249* (2021.05); *B32B 15/08* (2013.01); *C08J 5/244* (2021.05); *C08K 5/5313* (2013.01); *C08K 5/5397* (2013.01); *H05K 1/0366* (2013.01); *H05K 1/0373* (2013.01); *B32B 2250/02* (2013.01); *B32B 2307/206* (2013.01);
(Continued)

(58) Field of Classification Search
None
See application file for complete search history.

(56) References Cited

U.S. PATENT DOCUMENTS

2023/0062178 A1* 3/2023 Hsieh ........................ B32B 5/02

FOREIGN PATENT DOCUMENTS

| | | | |
|---|---|---|---|
| JP | 2014-198780 A | | 10/2014 |
| TW | 779795 B1 | * | 10/2022 |
| TW | I779795 B | | 10/2022 |

* cited by examiner

*Primary Examiner* — Christopher M Polley
(74) *Attorney, Agent, or Firm* — GREENBLUM & BERNSTEIN, P.L.C.

(57) ABSTRACT

A resin composition contains a preliminary reaction product (A) obtained by previously reacting a mixture containing a maleimide compound (a1) having two or more maleimide groups in a molecule and a phosphorus-containing compound (a2) that is at least one of a 9,10-dihydro-9-oxa-10-phosphaphenanthrene-10-oxide compound or a diphenylphosphine oxide compound; and a thermosetting resin (B) having two or more unsaturated double bonds.

14 Claims, 3 Drawing Sheets

(51) Int. Cl.
*C08K 5/5397* (2006.01)
*H05K 1/03* (2006.01)

(52) U.S. Cl.
CPC ....... *B32B 2457/08* (2013.01); *C08J 2371/12* (2013.01); *H05K 2201/0209* (2013.01)

RESIN COMPOSITION AND PREPREG, FILM WITH RESIN, METAL FOIL WITH RESIN, METAL-CLAD LAMINATED PLATE, AND WIRING BOARD USING SAME

TECHNICAL FIELD

The present invention relates to a resin composition, and a prepreg using the resin composition, a film with resin, a metal foil with resin, a metal-clad laminate, and a wiring board.

BACKGROUND ART

In recent years, along with an increased amount of information processed, various electronic devices have rapidly progressed in mounting technologies such as higher integration of semiconductor devices to be mounted, higher density for wiring, and multi-layering. Substrate materials for constituting base materials of wiring boards used in various electronic devices are required to have low electrical properties such as dielectric constant and dielectric loss tangent to increase the transmission speed of signals and decrease the loss during signal transmission.

Since a substrate material for a printed wiring board or a semiconductor package is required to have high flame retardancy, a flame retardant is generally added to a resin composition used as an insulating material of the substrate material. As the flame retardant, a halogen-based flame retardant such as a bromine-based flame retardant and the like are also known, but a cured product of such resin composition containing a halogen may produce a harmful substance such as hydrogen halide at the time of combustion, and has a disadvantage of negatively affecting humans and the natural environment. Because of this situation, an insulating material for printed wiring boards also are required to be halogen-free.

A phosphorus-based flame retardant known as a non-halogen flame retardant is assumed to exhibit a flame retardant effect by the promotion effects of a phosphorus compound on the carbonization of a synthetic resin to turn the surface thereof into a char layer during combustion thereby shielding thermal energy of an ignition source or shielding air required for combustion.

Hitherto, it has been reported that flame retardancy can be secured while the performance as a printed wiring board is maintained to a certain degree by adding 9,10-dihydro-9-oxa-10-phosphaphenanthrene-10-oxide derivatives to thermosetting resins such as PPE (polyphenylene ether) compounds (Patent Literature 1).

Although 9,10-dihydro-9-oxa-10-phosphaphenanthrene-10-oxide (hereinafter also referred to as "DOPO") used in the composition described in Patent Literature 1 exhibits excellent flame retardancy, in a case where DOPO is blended in a resin composition, there is a problem that the coefficient of thermal expansion of the cured product increases due to unreacted DOPO and the low dielectric properties also deteriorate.

Moreover, wiring boards used in various electronic devices are also required to be hardly affected by changes in the external environment. For example, substrate materials for forming insulating layers of wiring boards are required to afford cured products exhibiting low water absorbing properties so that the wiring boards can also be used in a high humidity environment. It is considered that the insulating layers of wiring boards obtained from such substrate materials that afford cured products exhibiting low water absorbing properties can suppress moisture absorption.

The present invention is made in view of such circumstances, and an object thereof is to provide a resin composition, a cured product of which exhibits low water absorbing properties, a low coefficient of thermal expansion, and low dielectric properties (low dielectric loss tangent) as well as exhibits excellent flame retardancy.

CITATION LIST

Patent Literature

Patent Literature 1: JP 2014-198780 A

SUMMARY OF INVENTION

A resin composition according to an aspect of the present invention contains a preliminary reaction product (A) obtained by previously reacting a mixture containing a maleimide compound (a1) having two or more maleimide groups in a molecule and a phosphorus-containing compound (a2) that is at least one of a 9,10-dihydro-9-oxa-10-phosphaphenanthrene-10-oxide compound or a diphenylphosphine oxide compound; and a thermosetting resin (B) having two or more unsaturated double bonds.

DESCRIPTION OF EMBODIMENTS

Figure 1:
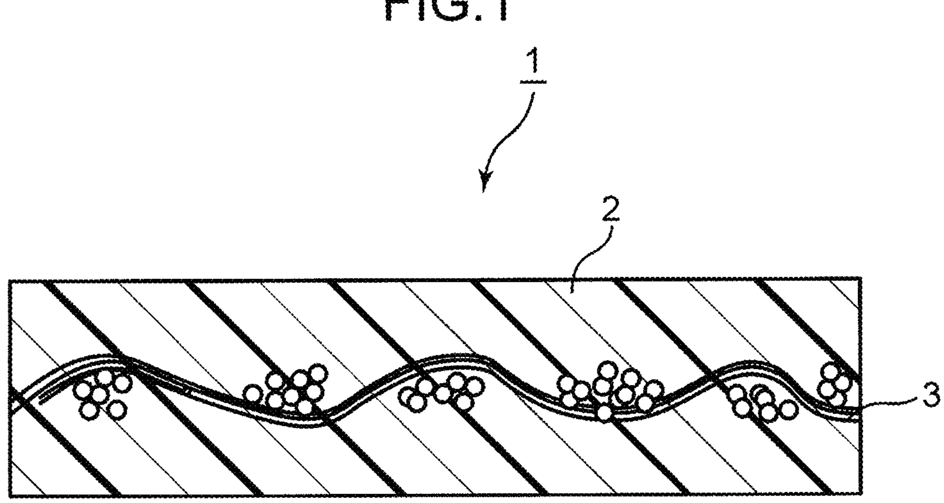
FIG. 1 is a schematic sectional view illustrating the configuration of a prepreg according to an embodiment of the present invention.

A resin composition according to an embodiment of the present invention (hereinafter also simply referred to as the resin composition) contains a preliminary reaction product (A) obtained by previously reacting a mixture containing a maleimide compound (a1) having two or more maleimide groups in a molecule and a phosphorus-containing compound (a2) that is at least one of a 9,10-dihydro-9-oxa-10-phosphaphenanthrene-10-oxide compound or a diphenylphosphine oxide compound: and a thermosetting resin (B) having two or more unsaturated double bonds.

By the configuration, it is possible to provide a resin composition, a cured product of which and a laminate and a wiring board that contain the cured product maintain high flame retardancy and exhibit low water absorbing properties, a low coefficient of thermal expansion, and low dielectric properties (low dielectric loss tangent), although the resin composition does not contain a halogen atom. By using the resin composition, it is possible to provide a prepreg, a film with resin, a metal foil with resin, a metal-clad laminate, and a wiring board, which exhibit low water absorbing properties, a low coefficient of thermal expansion, and low dielectric properties (low dielectric loss tangent) as well as exhibit excellent flame retardancy.

Hereinafter, the respective components of the resin composition according to the present embodiment will be specifically described.

Preliminary Reaction Product (A)

The resin composition of the present embodiment contains a preliminary reaction product (reaction product) (A) obtained by previously reacting a mixture containing a maleimide compound (a1) having two or more maleimide groups in the molecule and a phosphorus-containing compound (a2) that is at least one of a 9,10-dihydro-9-oxa-10-phosphaphenanthrene-10-oxide compound or a diphenylphosphine oxide compound. The mixture may further contain other components as long as it contains the maleimide compound (a1) component and the phosphorus-containing compound (a2) component, and examples of the third component include a catalyst, a curing accelerator, and another resin.

In other words, the resin composition of the present embodiment contains the preliminary reaction product (A) obtained by previously reacting, that is, preliminarily reacting at least some of the maleimide groups of the maleimide compound (a1) with the phosphorus-containing compound (a2) that is at least one of a 9,10-dihydro-9-oxa-10-phosphaphenanthrene-10-oxide (hereinafter also simply referred to as "DOPO") compound or a diphenylphosphine oxide compound.

By previously reacting the maleimide compound (a1) with the phosphorus-containing compound (a2) in this manner, the phosphaphenanthrene skeleton of DOPO and/or the diphenylphosphine oxide skeleton of the diphenylphosphine oxide compound are bonded to some of the maleimide groups, and it is thus considered that it is possible to suppress the deterioration of low dielectric properties, low coefficient of thermal expansion, and low water absorbing properties that may occur when DOPO or the like is directly blended in a resin composition.

In the present embodiment, the 9,10-dihydro-9-oxa-10-phosphaphenanthrene-10-oxide compound and the diphenylphosphine oxide compound also comprise respective derivatives thereof.

The preliminary reaction product (A) obtained by previously reacting the maleimide compound (a1) with the phosphorus-containing compound (a2) (hereinafter, also simply referred to as the "preliminary reaction product") of the present embodiment preferably comprises a phosphorus-containing maleimide compound (A-1) that is at least one of a phosphorus-containing maleimide compound having a group represented by the following Formula (1) or a phosphorus-containing maleimide compound having a group represented by the following Formula (2).

[Chem. 1]

(1)

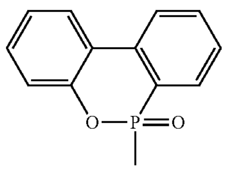

-continued

[Chem. 2]

(2)

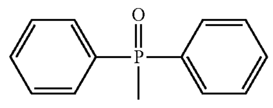

The phosphorus-containing maleimide compound (A-1) preferably comprises a phosphorus-containing maleimide compound (A-2) that is at least one of phosphorus-containing maleimide compounds having a group represented by the following Formula (3) or (4).

[Chem. 3]

(3)

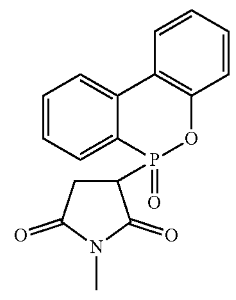

[Chem. 4]

(4)

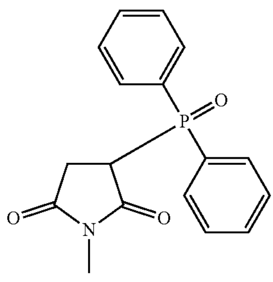

It is considered that as the phosphorus-containing maleimide compound (A-2) is contained, there is an advantage of imparting flame retardancy as well as suppressing deterioration of mechanical properties and electrical properties.

In the present embodiment, the preliminary reaction product (A) is preferably a reaction product (product) obtained by preliminarily reacting the maleimide compound (a1) with the phosphorus-containing compound (a2) that is at least one of a DOPO compound or a diphenylphosphine oxide compound at a ratio of (a1):(a2)=50:50 to 95:5 in terms of mass ratio. It is considered that high flame retardancy can be more reliably attained as the compounds are reacted at such a ratio. A more preferable range of the ratio of (a1):(a2) is 55:45 to 90:10.

In the preliminary reaction product (A) of the present embodiment, the reaction of the maleimide compound (a1) with the phosphorus-containing compound (a2) may not be completed fully, and the rest may remain unreacted as long as a part of the compounds has been reacted. In other words, the preliminary reaction product (A) of the present embodiment may contain a part of the maleimide compound (a1) and the phosphorus-containing compound (a2) that remains unreacted in addition to the preliminary reaction product of the components (a1) and (a2).

The proportion of reaction in the preliminary reaction product (A) is not particularly limited, but it is preferable to conduct the reaction so that the reaction rate of the phosphorus-containing compound (a2) component is, for example, 30% or more and less than 100%. The reaction rate here is determined from the peak area value of the phosphorus-containing compound (a2) component and the peak area value of the preliminary reaction product (A) in 31P-NMR analysis. More specifically, the preliminary reaction product (A) contains an unreacted phosphorus-containing compound (a2) and a phosphorus-containing compound (a2-1) obtained by preliminarily reacting the phosphorus-containing compound (a2). In the present embodiment, the reaction rate is determined by a calculation formula of peak area value of phosphorus-containing compound (a2-1)/(peak area value of (a2) component +peak area value of phosphorus-containing compound (a2-1) in the $^{31}$P-NMR chart. By conducting the reaction so that the reaction rate of the phosphorus-containing compound (a2) is in the above range, it is considered that it is possible to more reliably attain the effect of being able to improve low dielectric properties, low coefficient of thermal expansion, and low water absorbing properties as well as securing flame retardancy in the cured product of the resin composition. A more preferable range of the reaction rate is 50% or more and 100% or less.

As more specific reaction conditions, for example, in a case where a DOPO compound is used as the phosphorus-containing compound (a2), the reaction may be conducted by adding the maleimide compound (a1) and the DOPO compound (a2) to a solvent such as toluene at the ratio as described above so that the solid concentration is about 50% to 70% and reacting the compounds at a temperature of about 90° C. to 120° C. for about 3 to 9 hours.

Alternatively, in a case where a diphenylphosphine oxide compound is used as the phosphorus-containing compound (a2), the preliminary reaction product (A) may be obtained by adding the maleimide compound (a1) and the diphenylphosphine oxide compound (a2) to a solvent such as toluene at the ratio as described above so that the solid concentration is about 50% to 70% and reacting the compounds at a temperature of about 90° C. to 120° C. for about 1 to 3 hours.

The maleimide compound (a1) that can be used in the preliminary reaction product (A) of the present embodiment is not particularly limited as long as it is a polyfunctional maleimide compound having two or more maleimide groups in the molecule. Such a maleimide compound (a1) reacts with both DOPO and the thermosetting resin (B), and there is an advantage of being able to suppress deterioration of mechanical properties and electrical properties while imparting impartment of flame retardancy.

More specific examples include a maleimide compound having two or more N-substituted maleimide groups in the molecule and a modified maleimide compound. These may be used singly or can be used in combination of two or more kinds thereof.

The maleimide compound (a1) used in the present embodiment may be a commercially available product, and for example, the solid components in MIR-3000-70MT and MIR-5000-60T manufactured by Nippon Kayaku Co., Ltd.: BMI-4000, BMI-2300, BMI-5100, and BMI-TMH manufactured by Daiwa Fine Chemicals Co., Ltd.: BMI-689, BMI-1500, BMI-3000J, and BMI-5000 manufactured by Designer Molecules Inc. may be used.

Alternatively, a maleimide compound containing an indane structure may be used as the maleimide compound (a1). More specific examples include a maleimide compound having a structure represented by the following Formula (5) in the molecule.

[Chem. 5]

(5)

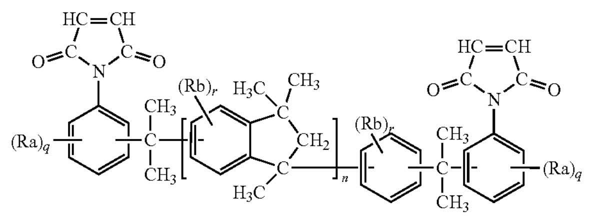

In Formula (5), Ra's are independent of each other. In other words, Ra's may be the same group as or different groups from each other, and for example, when q is 2 to 4, two to four Ra's bonded to the same benzene ring may be the same group as or different groups from each other. Ra represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. Rb's each independently represent an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. q represents an integer from 0 to 4. r represents an integer from 0 to 3. n represents an integer from 0.95 to 10.

In the preliminary reaction product (A) of the present embodiment, at least one of a 9,10-dihydro-9-oxa-10-phosphaphenanthrene-10-oxide compound or a diphenylphosphine oxide compound is used as the phosphorus-containing compound (a2) to be preliminarily reacted with the maleimide compound (a1).

The 9, 10-dihydro-9-oxa-10-phosphaphenanthrene-10-oxide compound is a compound containing a group represented by Formula (1), and the compound also comprises 9,10-dihydro-9-oxa-10-phosphaphenanthrene-10-oxide and derivatives thereof.

The diphenylphosphine oxide compound is a compound containing a group represented by Formula (2), and the compound also comprises derivatives of diphenylphosphine oxide.

The DOPO and diphenylphosphine oxide compound (a2) are phosphorus-based flame retardants exhibiting high flame retardancy, and by containing the preliminary reaction product (A) obtained using the phosphorus-containing compound (a2) that is at least one of these compounds or derivatives thereof, the resin composition of the present embodiment can exert high flame retardancy: DOPO and DOPO derivatives can be synthesized by known methods, but commercially available products can also be used, and for example, "HCA" manufactured by SANKO Inc. can be used. As the diphenylphosphine oxide compound, "OX-2" manufactured by KATAYAMA CHEMICAL INDUSTRIE Co., Ltd., and the like can be used.

Thermosetting Resin (B)

The thermosetting resin (B) used in the present embodiment is not particularly limited as long as it is a resin that exhibits thermosetting properties, has two or more unsaturated double bonds, and can be used as a wiring board material. As such a thermosetting resin (B) having two or more unsaturated double bonds is used, there is an advantage of being able to impart low dielectric properties and high heat resistance.

Specific examples of the thermosetting resin (B) include a polyphenylene ether compound, an allyl compound, an acrylate compound, a methacrylate compound, a vinyl compound, a styrenic compound, a maleimide compound (b1) different from the maleimide compound (a1), and a benzoxazine compound having an allyl group in the molecule, each of which has two or more unsaturated double bonds.

Among these, it is more preferable to use a resin, a cured product of which has a low dielectric loss tangent and a low coefficient of thermal expansion and exhibits low water absorbing properties. Specifically, it is preferable to contain at least one selected from a polyphenylene ether compound, a maleimide compound (b1), or a styrenic compound.

In the present embodiment, the polyphenylene ether compound having two or more unsaturated double bonds is preferably a modified polyphenylene ether compound substituted with chloromethylstyrene, methacryloyl chloride, or the like, and the like. The polyphenylene ether compound can be synthesized by a known method, or a commercially available product can be used. Examples of the commercially available product include "OPE-2st 1200" and "OPE-2st 2200" manufactured by Mitsubishi Gas Chemical Company Inc., and "SA9000", "SA90", "SA 120" and "Noryl640" manufactured by SABIC Innovative Plastics.

The allyl compound that can be used in the present embodiment is a polyfunctional allyl compound having two or more allyl groups in the molecule, and examples thereof include a triallyl isocyanurate compound such as triallyl isocyanurate (TAIC), a diallyl bisphenol compound, and diallyl phthalate (DAP).

The acrylate compound that can be used in the present embodiment is a compound having an acryloyl group in the molecule, and examples thereof include a polyfunctional acrylate compound having two or more acryloyl groups in the molecule. Examples of the polyfunctional acrylate compound include diacrylate compounds such as tricyclodecanedimethanol diacrylate.

The methacrylate compound that can be used in the present embodiment is a compound having a methacryloyl group in the molecule, and examples thereof include a polyfunctional methacrylate compound having two or more methacryloyl groups in the molecule. Examples of the polyfunctional methacrylate compound include dimethacrylate compounds such as tricyclodecanedimethanol dimethacrylate (DCP).

The vinyl compound that can be used in the present embodiment is a compound having a vinyl group in the molecule, and examples thereof include a polyfunctional vinyl compound having two or more vinyl groups in the molecule. Examples of the polyfunctional vinyl compound include divinylbenzene, curable polybutadiene having a carbon-carbon unsaturated double bond in the molecule, and a curable butadiene-styrene copolymer having a carbon-carbon unsaturated double bond in the molecule.

The styrenic compound that can be used in the present embodiment is not particularly limited as long as it is a compound having a styrene group, and examples thereof include a styrenic compound represented by the following Formula (6).

[Chem. 6]

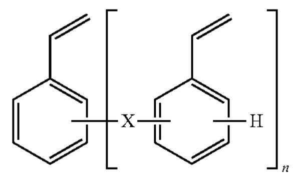

(6)

In Formula (6), X represents a hydrocarbon group having 6 or more carbon atoms, which contain at least one selected from an aromatic cyclic group or an aliphatic cyclic group. n represents an integer from 1 to 10.

More specific examples include a styrenic compound represented by the following Formula (7).

[Chem. 7]

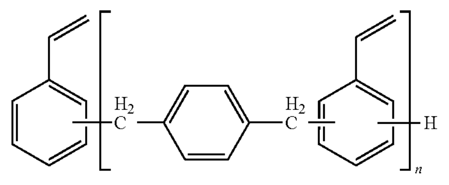

(7)

In Formula (7), n represents an integer from 1 to 10.

The maleimide compound (b1) is not particularly limited as long as it is a maleimide compound different from the maleimide compound (a1) described above, but examples thereof include maleimide compounds such as 4,4'-diphenylmethane bismaleimide, polyphenylmethane maleimide, m-phenylene bismaleimide, and a 4-methyl-1,3-phenylene bismaleimide compound.

The benzoxazine compound is not limited as long as it is a benzoxazine compound having an allyl group in the molecule, and for example, a benzoxazine compound represented by the following General Formula (C-I) can be used.

[Chem. 8]

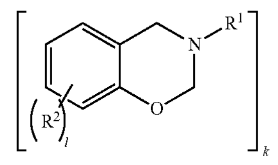

(C-I)

In Formula (C-I), $R^1$ represents a k-valent group and $R^2$ represents an aryl group. k represents an integer from 2 to 4 and I represents an integer from 0 to 4. As the benzoxazine compound, a commercially available product may be used, and specific examples thereof include "ALP-d" manufactured by SHIKOKU CHEMICALS CORPORATION.

Content Ratio and Content

In the resin composition of the present embodiment, the contents of the preliminary reaction product (A) and the thermosetting resin (B) are not particularly limited, but the preliminary reaction product (A) and the thermosetting resin (B) are preferably contained so that the ratio of the preliminary reaction product (A) to the thermosetting resin (B) is 70:30 to 10:90 in terms of mass ratio. It is considered that as the content ratio of the preliminary reaction product (A) to the thermosetting resin (B) in the resin composition is in the above range, low dielectric properties (particularly, low dielectric loss tangent) are more reliably attained. A more preferable range of the content ratio is 65:35 to 25:75 in terms of mass ratio.

In the resin composition of the present embodiment, the content of the preliminary reaction product (A) is about 15 to 70 parts by mass, more preferably about 25 to 65 parts by mass when the resin components in the resin composition are set to 100 parts by mass. The content of the thermosetting resin (B) is about 30 to 85 parts by mass, more preferably about 35 to 75 parts by mass when the resin components in the resin composition are set to 100 parts by mass.

Inorganic Filler

The resin composition according to the present embodiment may further contain an inorganic filler. The inorganic filler is not particularly limited and includes those added to enhance the heat resistance and flame retardancy of the cured product of a resin composition. By containing an inorganic filler, it is considered that heat resistance, flame retardancy and the like can be further enhanced as well as the coefficient of thermal expansion can be kept lower (achievement of even lower thermal expansion properties).

Specific examples of the inorganic filler that can be used in the present embodiment include metal oxides such as silica, alumina, titanium oxide, magnesium oxide, and mica, metal hydroxides such as magnesium hydroxide and aluminum hydroxide, talc, aluminum borate, barium sulfate, aluminum nitride, boron nitride, barium titanate, strontium titanate, calcium titanate, aluminum titanate, barium zirconate titanate, barium zirconate, calcium zirconate, zirconium phosphate, zirconium tungstate phosphate, magnesium carbonate such as anhydrous magnesium carbonate, calcium carbonate, and boehmite-treated products thereof. Among these, silica, metal hydroxides such as magnesium hydroxide and aluminum hydroxide, aluminum oxide, boron nitride, and barium titanate, strontium titanate and the like are preferable, and silica is more preferable. The silica is not particularly limited, and examples thereof include crushed silica, spherical silica, and silica particles.

These inorganic fillers may be used singly or in combination of two or more kinds thereof. An inorganic filler as described above may be used as it is, but one subjected to a surface treatment with an epoxysilane-type, vinylsilane-type, methacrylsilane-type, phenylaminosilane-type, or aminosilane-type silane coupling agent may be used. The silane coupling agent can be used by being added to the filler by an integral blend method instead of the method of treating the surface of the filler with the silane coupling agent in advance.

In a case where the resin composition of the present embodiment contains an inorganic filler, the content of the inorganic filler is preferably 10 to 300 parts by mass, more preferably 20 to 200 parts by mass with respect to 100 parts by mass of the total mass of the preliminary reaction product (A) and the thermosetting resin (B).

Other Components

The resin composition according to the present embodiment may contain components (other components) in addition to the components described above if necessary as long as the effects of the present invention are not impaired. As the other components contained in the resin composition according to the present embodiment, for example, additives such as a resin component other than the maleimide compound (a1) and the thermosetting resin (B) described above, a flame retardant other than the 9,10-dihydro-9-oxa-10-phosphaphenanthrene-10-oxide (a2) or derivatives thereof, catalysts such as a reaction initiator and a reaction accelerator, a silane coupling agent, a polymerization inhibitor, a polymerization retarder, an auxiliary flame retardant, an antifoaming agent, a leveling agent, an antioxidant, a heat stabilizer, an antistatic agent, an ultraviolet absorber, a dye or pigment, a dispersant, and a lubricant may be further contained.

Examples of the other resin include an epoxy resin, a phenolic resin, and a cyanate ester.

Examples of the other flame retardant include phosphorus-based flame retardants such as a phosphate ester-based flame retardant, a phosphazene-based flame retardant, a bis(diphenylphosphine oxide)-based flame retardant, and a phosphinate salt-based flame retardant.

The resin composition according to the present embodiment may contain a reaction initiator (catalyst) and a reaction accelerator as described above. The reaction initiator and reaction accelerator are not particularly limited as long as they can promote the curing reaction of the resin composition. Specifically, examples thereof include metal oxides, azo compounds, peroxides, imidazole compounds, phosphorus-based curing accelerators, and amine-based curing accelerators.

Specific examples of metal oxides include zinc octylate, tin octylate, zinc naphthenate, cobalt naphthenate, tin stearate, and zinc stearate.

Examples of peroxides include α,α'-di(t-butylperoxy)diisopropylbenzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

Specific examples of azo compounds include 2,2'-azobis(2,4,4-trimethylpentane), 2,2'-azobis(N-butyl-2-methylpropionamide), and 2,2'-azobis (2-methylbutyronitrile).

Among these, α,α'-di(t-butylperoxy)diisopropylbenzene is preferably used as a preferable reaction initiator. α,α'-Di(t-butylperoxy)diisopropylbenzene exhibits low volatility, thus does not volatilize at the time of drying and storage, and exhibits favorable stability. α,α'-Di(t-butylperoxy)diisopropylbenzene has a relatively high reaction initiation temperature and thus can suppress the promotion of the curing reaction at the time point at which curing is not required, for example, at the time of prepreg drying. By suppressing the curing reaction, it is possible to suppress a decrease in storage stability of the resin composition.

Examples of phosphorus-based curing accelerators include triphenylphosphine, phosphonium borate compounds, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate.

Examples of amine-based curing accelerators include trialkylamines such as triethylamine and tributylamine, 4-dimethylaminopyridine (DMAP), benzyldimethylamine, 2,4,6-tris(dimethylaminomethyl)phenol, and 1,8-diazabicyclo (5,4,0)-undecene.

Examples of imidazole-based compounds include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo [1,2-a] benzimidazole, 1-dodecyl-2-methyl-3-benzylimidazolium chloride, 2-methylimidazoline, and 2-phenylimidazoline.

The reaction initiators as described above may be used singly or in combination of two or more kinds thereof.

In a case where the resin composition of the present embodiment contains the reaction initiator, the content of the reaction initiator is not particularly limited, but is, for example, preferably 0.01 to 5.0 parts by mass, more preferably 0.01 to 3 parts by mass, still more preferably 0.05 to 3.0 parts by mass with respect to 100 parts by mass of the sum of the maleimide compound (A) and the hydrocarbon-based compound (B) (and the reactive compound (C) in a case of containing the reactive compound (C)).

Prepreg, Film With Resin, Metal-Clad Laminate, Wiring Board, and Metal Foil With Resin Next, a prepreg for wiring board, a metal-clad laminate, a wiring board, and a metal foil with resin obtained using the resin composition of the present embodiment will be described.

FIG. 1 is a schematic sectional view illustrating an example of a prepreg 1 according to an embodiment of the present invention. The respective symbols in the drawings indicate the following: 1 prepreg, 2 resin composition or semi-cured product of resin composition, 3 fibrous base material, 11 metal-clad laminate, 12 insulating layer, 13 metal foil, 14 wiring, 21 wiring board, 31 metal foil with resin, 32, 42 resin layer, 41 film with resin, and 43 support film.

As illustrated in FIG. 1, the prepreg 1 according to the present embodiment includes the resin composition or a semi-cured product 2 of the resin composition and a fibrous base material 3. Examples of the prepreg 1 include those in which the fibrous base material 3 is present in the resin composition or a semi-cured product 2 thereof. In other words, the prepreg 1 includes the resin composition or semi-cured product thereof: and the fibrous base material 3 present in the resin composition or semi-cured product 2 thereof.

In the present embodiment, the "semi-cured product" is one in a state where the resin composition is partly cured so as to be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state where the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous base material, or may be a prepreg including the resin composition before curing (the resin composition in A stage) and a fibrous base material. Specific examples of the prepreg include those in which a fibrous base material is present in the resin composition. The resin composition or semi-cured product thereof may be one obtained by heating and drying the resin composition.

When the prepreg and the metal foil with resin, metal-clad laminate and the like to be described later are fabricated, the resin composition according to the present embodiment is often prepared in the form of a varnish and used as a resin varnish. Such a resin varnish is prepared, for example, as follows.

First, a mixture containing the maleimide compound (a1) and the phosphorus-containing compound (a2) is reacted under the conditions as described above to obtain the preliminary reaction product (A). Next, the preliminary reaction product (A), the thermosetting resin (B), and each component that can be dissolved in an organic solvent, such as a reaction initiator, are added to and dissolved in an organic solvent. At this time, heating may be performed, if necessary. Thereafter, an inorganic filler and the like, which are components that do not dissolve in an organic solvent, are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the preliminary reaction product (A), the thermosetting resin (B) and the like and does not inhibit the curing reaction. Specific examples thereof include toluene, methyl ethyl ketone, cyclohexanone, cyclopentanone, methylcyclohexane, dimethylformamide, and propylene glycol monomethyl ether acetate. These may be used singly or two or more kinds thereof may be used concurrently.

Examples of the method for fabricating the prepreg 1 of the present embodiment using the varnish-like resin composition of the present embodiment include a method in which the fibrous base material 3 is impregnated with the resin composition 2 in the form of a resin varnish and then drying is performed.

Specific examples of the fibrous base material used in fabrication of the prepreg include glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. When glass cloth is used, a laminate exhibiting excellent mechanical strength is obtained, and glass cloth subjected to flattening is particularly preferable. The glass cloth used in the present embodiment is not particularly limited, but examples thereof include glass cloth with low dielectric constant such as E glass, S glass, NE glass, Q glass, and L glass. Specifically, the flattening can be carried out, for example, by continuously pressing the glass cloth with press rolls at an appropriate pressure to flatten the yarn. As for the thickness of the fibrous base material, for example, a fibrous base material having a thickness of 0.01 to 0.3 mm can be generally used.

Impregnation of the fibrous base material 3 with the resin varnish (resin composition 2) is performed by dipping, coating, or the like. This impregnation can be repeated multiple times if necessary. At this time, it is also possible to repeat impregnation using a plurality of resin varnishes having different compositions and concentrations, and adjust the composition (content ratio) and resin amount to the finally desired values.

The fibrous base material 3 impregnated with the resin varnish (resin composition 2) is heated under desired heating conditions, for example, at 80° C. or more and 180° C. or less for 1 minute or more and 10 minutes or less. By heating, the solvent is volatilized from the varnish and the solvent is diminished or removed to obtain the prepreg 1 before curing (in A stage) or in a semi-cured state (B stage).

Figure 4:
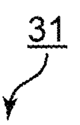
FIG. 4 is a schematic sectional view illustrating the configuration of a metal foil with resin according to an embodiment of the present invention.
Figure 4:
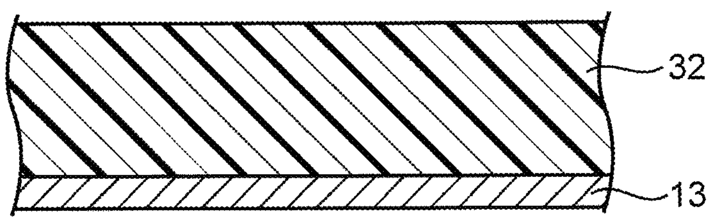

As illustrated in FIG. 4, a metal foil with resin 31 of the present embodiment has a configuration in which a resin layer 32 containing the resin composition described above or a semi-cured product of the resin composition: and a metal foil 13 are laminated. In other words, the metal foil with resin of the present embodiment may be a metal foil with resin including a resin layer containing the resin composition before curing (the resin composition in A stage) and a metal foil, or may be a metal foil with resin including a resin layer containing a semi-cured product of the resin composition (the resin composition in B stage) and a metal foil.

Examples of the method for fabricating such a metal foil with resin 31 include a method in which a resin composition in the form of a resin varnish as described above is applied to the surface of the metal foil 13 such as a copper foil and then dried. Examples of the coating method include a bar coater, a comma coater, a die coater, a roll coater, and a gravure coater.

As the metal foil 13, metal foils used in metal-clad laminates, wiring boards and the like can be used without limitation, and examples thereof include copper foil and aluminum foil.

Figure 5:
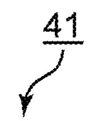
FIG. 5 is a schematic sectional view illustrating the configuration of a resin film according to an embodiment of the present invention.
Figure 5:
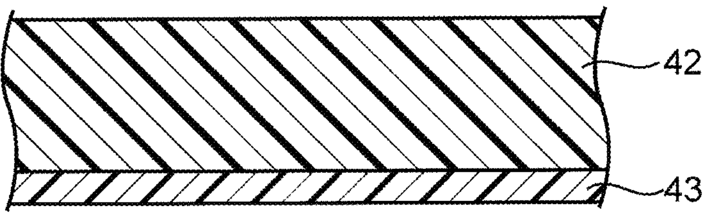

As illustrated in FIG. 5, a film with resin 41 of the present embodiment has a configuration in which a resin layer 42 containing the resin composition described above or a semi-cured product of the resin composition: and a film supporting base material 43 are laminated. In other words, the film with resin of the present embodiment may be a film with resin in which the resin composition before curing (the resin composition in A stage) and a film supporting base material are included, or may be a film with resin in which a semi-cured product of the resin composition (the resin composition in B stage); and a film supporting base material are included.

As the method of fabricating such a film with resin 41, for example, a resin composition in the form of a resin varnish as described above is applied onto the surface of the film supporting base material 43, and then the solvent is volatilized from the varnish to reduce the solvent or to remove the solvent, thereby enabling to obtain a film with resin before curing (A stage) or in a semi-cured state (B stage).

Examples of the film supporting base material include electrical insulating films such as a polyimide film, a PET (polyethylene terephthalate) film, a polyethylene naphthalate film, a polyester film, a poly (parabanic acid) film, a polyether ether ketone film, a polyphenylene sulfide film, an aramid film, a polycarbonate film, and a polyarylate film.

In the film with resin and metal foil with resin of the present embodiment as well, the resin composition or semi-cured product thereof may be one obtained by drying or heating and drying the resin composition as in the prepreg described above.

The thickness and the like of the metal foil 13 and the film supporting base material 43 can be appropriately set depending on the desired purpose. For example, as the metal foil 13, a metal foil having a thickness of about 0.2 to 70 μm can be used. In a case where the thickness of metal foil is, for example, 10 μm or less, the metal foil may be a carrier-attached copper foil including a release layer and a carrier in order to improve handleability. The application of the resin varnish to the metal foil 13 and the film supporting base material 43 is performed by coating or the like, and this can be repeated multiple times if necessary. At this time, it is also possible to repeat coating using a plurality of resin varnishes having different compositions and concentrations, and adjust the composition (content ratio) and resin amount to the finally desired values.

The drying or heat-drying conditions in the method for producing the metal foil with resin 31 and the resin film 41 are not particularly limited, but the metal foil with resin 31 and the resin film 41 before curing (stage A) or in a semi-cured state (stage B) are obtained by applying the resin composition in the form of resin varnish to the metal foil 13 and the film supporting base material 43, and then heating under desired heating conditions, for example, at 50 to 180° C. for about 0.1 to 10 minutes to volatilize the solvent from the varnish to reduce or remove the solvent.

The metal foil with resin 31 and resin film 41 may include a cover film and the like if necessary. When a cover film is provided, foreign matter inclusion and the like can be prevented. The cover film is not particularly limited as long as it can be peeled off without damaging the form of the resin composition, and for example, a polyolefin film, a polyester film, a TPX film, films formed by providing a mold releasing agent layer on these films, and paper obtained by laminating these films on a paper substrate can be used.

Figure 2:
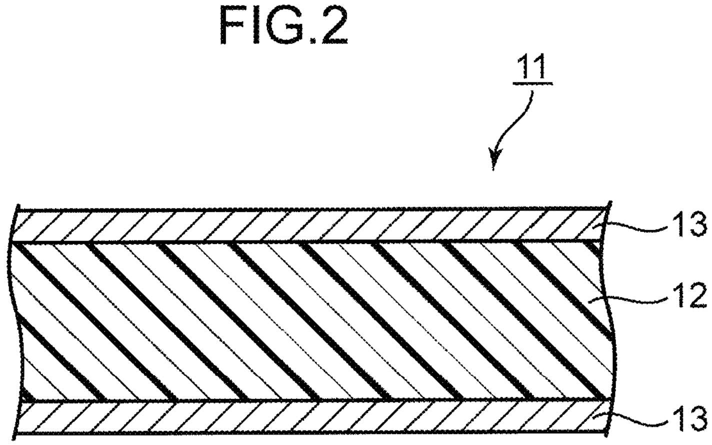
FIG. 2 is a schematic sectional view illustrating the configuration of a metal-clad laminate according to an embodiment of the present invention.

As illustrated in FIG. 2, a metal-clad laminate 11 of the present embodiment includes an insulating layer 12 containing a cured product of the resin composition described above or a cured product of the prepreg described above: and a metal foil 13. As the metal foil 13 used in the metal-clad laminate 11, a metal foil similar to the metal foil 13 described above can be used.

The metal-clad laminate 11 of the present embodiment can also be fabricated using the metal foil with resin 31 or resin film 41 described above.

As the method for fabricating a metal-clad laminate using the prepreg 1, metal foil with resin 31, or resin film 41 obtained in the manner described above, one or a plurality of prepregs 1, metal foils with resin 31, or resin films 41 are superimposed on one another, and the metal foils 13 such as copper foil are further superimposed on both upper and lower sides or on one side, and this is laminated and integrated by heating and pressing, whereby a double-sided metal-clad or single-sided metal-clad laminate can be fabricated. The heating and pressing conditions can be appropriately set depending on the thickness of the laminate to be fabricated, the kind of the resin composition, and the like, but for example, the temperature may be set to 170° C. to 230° C., the pressure may be set to 1.5 to 5.0 MPa, and the time may be set to 60 to 150 minutes.

The metal-clad laminate 11 may be fabricated by forming a film-like resin composition on the metal foil 13 without using the prepreg 1 or the like and performing heating and pressing.

Figure 3:
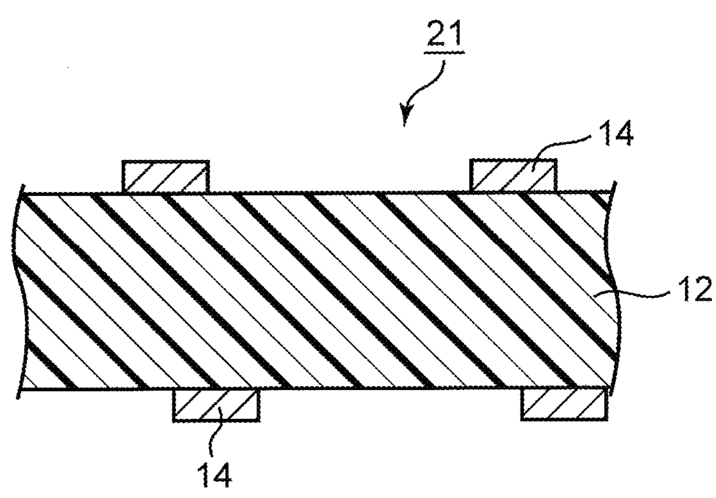
FIG. 3 is a schematic sectional view illustrating the configuration of a wiring board according to an embodiment of the present invention.

As illustrated in FIG. 3, a wiring board 21 of the present embodiment includes wiring 14 and an insulating layer 12 containing a cured product of the resin composition described above or a cured product of the prepreg described above.

The resin composition of the present embodiment is suitably used as a material for an insulating layer of a wiring board. As the method for fabricating the wiring board 21, for example, the metal foil 13 on the surface of the metal-clad laminate 11 obtained above is etched to form a circuit (wiring), whereby the wiring board 21 having a conductor pattern (wiring 14) provided as a circuit on the surface of a laminate can be obtained. Examples of the circuit forming method include circuit formation by a semi additive process (SAP) or a modified semi additive process (MSAP) in addition to the method described above.

The prepreg, film with resin, and metal foil with resin obtained using the resin composition of the present embodiment are extremely useful in industrial applications since the cured products thereof exhibit excellent low dielectric properties, low coefficient of thermal expansion, and flame retardancy as well as suppressed water absorbing properties. The metal-clad laminate and wiring board including an insulating layer containing the cured product of the resin composition of the present embodiment have advantages of exhibiting low dielectric properties, a low coefficient of thermal expansion, and flame retardancy and of being able to suppress water absorption (moisture absorption).

This specification discloses techniques in various aspects as described above, and the main techniques among them are summarized below.

A resin composition according to a first aspect of the present invention contains a preliminary reaction product (A) obtained by previously reacting a mixture containing a maleimide compound (a1) having two or more maleimide groups in a molecule and a phosphorus-containing compound (a2) that is at least one of a 9,10-dihydro-9-oxa-10-phosphaphenanthrene-10-oxide compound or a diphenylphosphine oxide compound: and a thermosetting resin (B) having two or more unsaturated double bonds.

A resin composition according to a second aspect of the present invention is the resin composition according to the first aspect, in which the preliminary reaction product (A) is a reaction product obtained by preliminarily reacting the maleimide compound (a1) with the phosphorus-containing compound (a2) that is at least one of a 9,10-dihydro-9-oxa-10-phosphaphenanthrene-10-oxide compound or a diphenylphosphine oxide compound at a ratio of 50:50 to 95:5 in terms of mass ratio.

A resin composition according to a third aspect of the present invention is the resin composition according to the first or second aspect, in which the preliminary reaction product (A) and the thermosetting resin (B) are contained at a ratio of 70:30 to 10:90 in terms of mass ratio.

A resin composition according to a fourth aspect of the present invention is the resin composition according to any one of the first to third aspects, in which the preliminary reaction product (A) includes a phosphorus-containing maleimide compound (A-1) that is at least one of a phosphorus-containing maleimide compound having a group represented by the following Formula (1) or a phosphorus-containing maleimide compound having a group represented by the following Formula (2).

A resin composition according to a fifth aspect of the present invention is the resin composition according to any one of the first to fourth aspects, in which the phosphorus-containing maleimide compound (A-1) includes a phosphorus-containing maleimide compound (A-2) that is at least one of phosphorus-containing maleimide compounds having a group represented by the following Formula (3) or (4).

A resin composition according to a sixth aspect of the present invention is the resin composition according to any one of the first to fifth aspects, in which the preliminary reaction product (A) contains an unreacted phosphorus-containing compound (a2) and a phosphorus-containing compound (a2-1) obtained by preliminarily reacting the phosphorus-containing compound (a2), and a reaction rate of the phosphorus-containing compound (a2) is 30% or more and 100% or less as determined by peak area value of phosphorus-containing compound (a2-1)/(peak area value of (a2) component +peak area value of phosphorus-containing compound (a2-1) in a $^{31}$P-NMR chart.

A resin composition according to a seventh aspect of the present invention is the resin composition according to any one of the first to sixth aspects, in which the thermosetting resin (B) contains at least one selected from the group consisting of a polyphenylene ether compound, an allyl compound, an acrylate compound, a methacrylate compound, a vinyl compound, a styrenic compound, a maleimide compound (b1) different from the maleimide compound (a1), and a benzoxazine compound having an allyl group, each of which has two or more unsaturated double bonds.

A resin composition according to an eighth aspect of the present invention is the resin composition according to any one of the first to seventh aspects, further containing an inorganic filler.

A prepreg according to a ninth aspect of the present invention includes the resin composition according to any one of the first to eighth aspects or a semi-cured product of the resin composition; and a fibrous base material.

A film with resin according to a tenth aspect of the present invention includes a resin layer containing the resin composition according to any one of the first to eighth aspects or a semi-cured product of the resin composition; and a support film.

A metal foil with resin according to an eleventh aspect of the present invention includes a resin layer containing the resin composition according to any one of the first to eighth aspects or a semi-cured product of the resin composition; and a metal foil.

A metal-clad laminate according to a twelfth aspect of the present invention includes an insulating layer containing a cured product of the resin composition according to any one of the first to eighth aspects or a cured product of the prepreg according to the ninth aspect; and a metal foil.

A wiring board according to a thirteenth aspect of the present invention includes an insulating layer containing a cured product of the resin composition according to any one of the first to eighth aspects or a cured product of the prepreg according to the ninth aspect; and a wiring.

Hereinafter, the present invention will be described more specifically with reference to Examples, but the scope of the present invention is not limited thereto.

EXAMPLES

First, the components to be used in the preparation of resin compositions in the present Examples will be described.

Maleimide Compound (a1)

Polyfunctional maleimide compound: MIR-5000 (manufactured by Nippon Kayaku Co., Ltd.)

Flame Retardant: Phosphorus-Containing Compound (a2)

9,10-Dihydro-9-oxa-10-phosphaphenanthrene-10-oxide: HCA (manufactured by SANKO Inc.)

Thermosetting Resin (B)

Polyphenylene ether compound: OPE-2St-1200 (manufactured by Mitsubishi Gas Chemical Company Inc.)

Inorganic Filler

Phenylaminosilane treated silica MEK slurry: SC2050-MTX (manufactured by ADMATECHS COMPANY LIMITED)

Preparation of Preliminary Reaction Product

Figure 6:
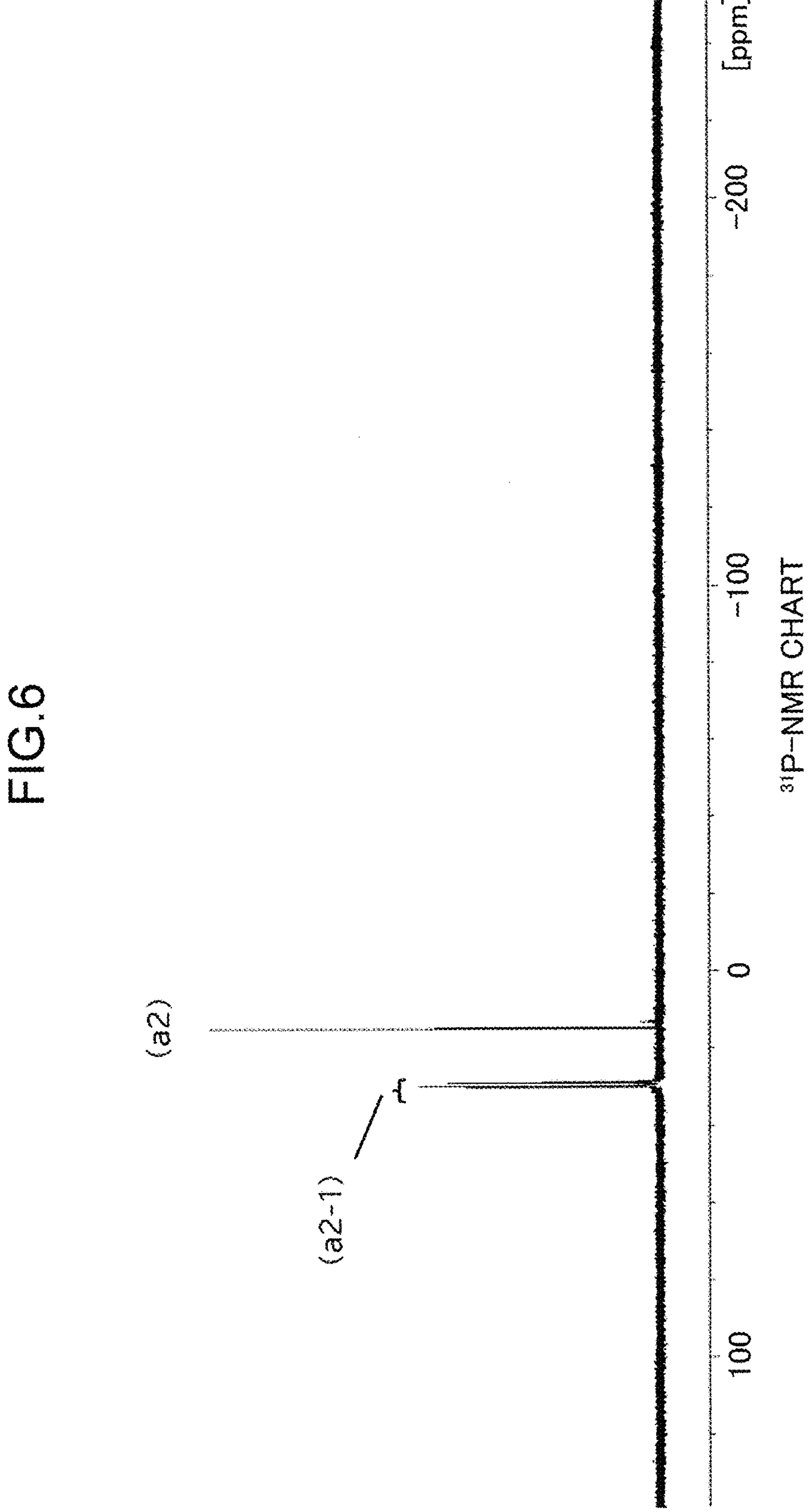
FIG. 6 is a $^{31}$P-NMR chart used for calculation of the reaction rate of DOPO in Example 1.

For Example 1 and Example 2, each component was added to toluene so as to have the blending proportion (parts by mass) presented in Table 1 below, and then stirring was performed at 120° C. for 6 hours. In this manner, the maleimide compound (a1) was previously reacted (preliminarily reacted) with the phosphorus-containing compound (a2) to prepare a preliminary reaction product. The solid concentration in each of the obtained preliminary reaction products was adjusted to be 60% to 70%. This preliminary reaction product contains an unreacted phosphorus-containing compound (a2) and a phosphorus-containing compound (a2-1) obtained by preliminarily reacting the phosphorus-containing compound (a2). The reaction rate of DOPO after the preliminary reaction was then measured as follows:

The reaction rate was determined from the peak area value of DOPO (unreacted phosphorus-containing compound (a2)) and the peak area value of the phosphorus-containing compound (a2-1) obtained by preliminarily reacting the phosphorus-containing compound (a2), which were acquired by conducting $^{31}$P-NMR analysis (a chart showing the analysis results of Example 1 is illustrated in FIG. 6 as an example). Specifically, the reaction rate was determined by calculating the phosphorus-containing compound (a2) that was determined by peak area value of phosphorus-containing compound (a2-1)/(peak area value of (a2) component+peak area value of phosphorus-containing compound (a2-1) in the 31P-NMR chart.

The results are presented in Table 1.

TABLE 1

| | Example 1 | Example 2 |
|---|---|---|
| Solvent (toluene) | 41 | 41 |
| Maleimide compound (a1) | 61 | 61 |
| Flame retardant (a2) | 26 | 13 |
| Solid concentration (%) | 69 | 64 |
| Reaction temperature (° C.) | 120 | 120 |
| Reaction time (hours) | 6 | 6 |

Examples 1 to 2 and Comparative Examples 1 to 2

Preparation Method

Resin Varnish

First, the respective components, that is, resin components (preliminary reaction product (A) and thermosetting resin (B)) were added to a toluene solvent) at the blending proportion (parts by mass) presented in Table 2 described later so that the solid concentration was 40% to 50% by mass, and mixed. An inorganic filler was added to the mixture, stirring was performed for 30 to 60 minutes, and then dispersion was performed using a bead mill to obtain a resin varnish. The P (phosphorus) concentration in the table is a value calculated by amount of phosphorus-containing compound (a2) blended×phosphorus concentration in phosphorus-containing compound (a2)/(amount of maleimide compound (a1) blended+amount of phosphorus-containing compound (a2) blended+amount of thermosetting resin (B) blended). The phosphorus concentration in the phosphorus-containing compound (a2) is 0.143.

In Comparative Example 1 and Comparative Example 2, a resin varnish was prepared in the same manner as in Example 1 and Example 2 except that the resin varnish was prepared without previously reacting (preliminarily reacting) the maleimide compound (a1) with the phosphorus-containing compound (a2).

Fabrication of Evaluation Sample

First, the varnish obtained above was impregnated into a fibrous base material (glass cloth: #2116 type, NE Glass manufactured by Nitto Boseki Co., Ltd.) and then heated and dried at 120° C. to 140° C. for 2 to 5 minutes, thereby fabricating a prepreg having a thickness of 100 μm. At that time, the content (resin content) of the components constituting the resin composition with respect to the prepreg was adjusted to be about 46% by mass by the curing reaction.

Next, an evaluation substrate (metal-clad laminate) was obtained as follows.

Copper foil (3EC-LP III manufactured by Mitsui Mining & Smelting Corporation, copper foil thickness: 12 μm) was disposed on both sides of each prepreg obtained. This as a body to be pressed was heated to a temperature of 220° C. at a rate of temperature rise of 3° C./min and heated and pressed under the conditions of 220° C., 120 minutes, and a pressure of 2 MPa, thereby obtaining an evaluation substrate (metal-clad laminate) having copper foil bonded to both surfaces and having a resin layer thickness of about 100 μm.

The evaluation substrates (metal-clad laminates) fabricated as described above were used to conduct evaluation tests by the following methods.

Evaluation Test

Dielectric Properties: Dielectric Loss Tangent (Df)

The dielectric loss tangent at 10 GHz was measured by the cavity perturbation method using an unclad substrate obtained by removing the copper foil from the evaluation substrate (metal-clad laminate) by etching as a test piece. Specifically, the relative dielectric constant and dielectric loss tangent of the evaluation substrate at 10 GHz were measured using a network analyzer (N5230A manufactured by Keysight Technologies). In the present test, it is determined as acceptable when the Df is 0.003 or less.

Coefficient of Thermal Expansion (CTE)

Using an unclad substrate obtained by removing the copper foil from the evaluation substrate (metal-clad laminate) by etching as a test piece, the coefficient of thermal expansion in the surface direction of the base material (tensile direction, Y direction) at a temperature less than the glass transition temperature of the resin cured product was measured by the TMA (Thermo-mechanical analysis) method. Specifically, a TMA system ("TMA6000" manufactured by SII NanoTechnology Inc.) was used for the measurement, and the measurement was performed in a tensile mode. In order to eliminate the influence of thermal strain on the test piece, the heating-cooling cycle was repeated two times, and the average coefficient of thermal expansion from 50° C. to 100° C. in the second temperature change chart was measured. A smaller value means a more favorable result. The unit is ppm/° C.

Measurement Conditions

1st cycle: Range of temperature rise: 30° C.→350° C.
Rate of temperature rise: 20° C./min, Load: 10 g
2nd cycle: Range of temperature rise: 30° C.→320° C.
Rate of temperature rise: 10° C./min, Load: 10 g Water Absorption Rate The water absorption rate (%) was measured in conformity with IPC-TM-650 2.6.2.1 using an unclad substrate obtained by removing the copper foil from the evaluation substrate (metal-clad laminate) by etching as a test piece. In this test, it is determined as acceptable when the water absorption rate is less than 0.3%.

Flame Retardancy

After the copper foil on the surface of the evaluation substrate (metal-clad laminate) was peeled off, the flammability was evaluated in conformity with the UL94 (0.8 mmt) flammability test.

The results are presented in Table 2.

TABLE 2

| | | Example 1 | Example 2 | Comparative Example 1 | Comparative Example 2 |
|---|---|---|---|---|---|
| Thermosetting resin (B) | Parts | 39 | 39 | 39 | 39 |
| Maleimide compound (a1) | Parts | 61 | 61 | 61 | 61 |
| Flame retardant (a2) | Parts | 26 | 13 | 26 | 13 |
| Filler | Parts | 121 | 121 | 121 | 121 |
| P concentration | % | 2.9 | 1.6 | 2.9 | 1.6 |
| Preliminary reaction | | Presence | Presence | Absence | Absence |
| Reaction rate | | 78.0 | 77.0 | — | — |

TABLE 2-continued

| | Example 1 | Example 2 | Comparative Example 1 | Comparative Example 2 |
|---|---|---|---|---|
| Evaluation result | | | | |
| Df@10 GHz | 0.0029 | 0.0028 | 0.0041 | 0.0033 |
| CTE (ppm/° C.) | 8.8 | 7.9 | 9.4 | 9.1 |
| Water absorption rate (%) | 0.24 | 0.25 | 0.41 | 0.31 |
| Flame retardancy | V-0 | V-0 | V-0 | V-0 |

Discussion

As is clear from the results in Table 2, it has been found that the cured products (insulating layers) of the resin compositions in Examples of the present invention all have a low dielectric loss tangent, a low coefficient of thermal expansion, and a low water absorption rate.

Meanwhile, in Comparative Examples 1 and 2 in which the maleimide compound (a1) and the phosphorus-containing compound (a2) were directly added without undergoing preliminary reaction, the flame retardancy was at the same level as in Examples but the dielectric loss tangent, the coefficient of thermal expansion, and the water absorption rate were high.

This application is based on Japanese patent application No. 2022-159545 filed on Oct. 3, 2022, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present invention has wide industrial applicability in technical fields such as electronic materials, electronic devices, and optical devices.

The invention claimed is:

1. A resin composition comprising:

a preliminary reaction product (A) obtained by previously reacting a mixture containing a maleimide compound (a1) having two or more maleimide groups in a molecule and a phosphorus-containing compound (a2) that is at least one of a 9,10-dihydro-9-oxa-10-phosphaphenanthrene-10-oxide compound or a diphenylphosphine oxide compound; and a thermosetting resin (B) having two or more unsaturated double bonds, wherein the preliminary reaction product (A) contains an unreacted phosphorus-containing compound (a2) and a phosphorus-containing compound (a2-1) obtained by preliminarily reacting the phosphorus-containing compound (a2), and a reaction rate of the phosphorus-containing compound (a2) is 50% or more and 100% or less as determined by peak area value of phosphorus-containing compound (a2-1)/(peak area value of (a2) component+peak area value of phosphorus-containing compound (a2-1)) in a $^{31}$P-NM chart.

2. The resin composition according to claim 1, wherein the preliminary reaction product (A) is a reaction product obtained by preliminarily reacting the maleimide compound (a1) with the phosphorus-containing compound (a2) that is at least one of a 9,10-dihydro-9-oxa-10-phospha-phenanthrene-10-oxide compound or a diphenylphosphine oxide compound at a ratio of 50:50 to 95:5 in terms of mass ratio.

3. The resin composition according to claim 1, wherein the preliminary reaction product (A) and the thermosetting resin (B) are contained at a ratio of 70:30 to 10:90 in terms of mass ratio.

4. The resin composition according to claim 1, wherein the preliminary reaction product (A) comprises a phosphorus-containing maleimide compound (A-1) that is at least one of a phosphorus-containing maleimide compound having a group represented by the following Formula (1) or a phosphorus-containing maleimide compound having a group represented by the following Formula (2).

(1)

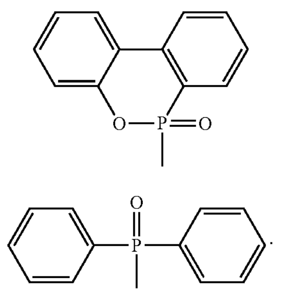

(2)

5. The resin composition according to claim 4, wherein the phosphorus-containing maleimide compound (A-1) comprises a phosphorus-containing maleimide compound (A-2) that is at least one of phosphorus-containing maleimide compounds having a group represented by the following Formula (3) or (4).

(3)

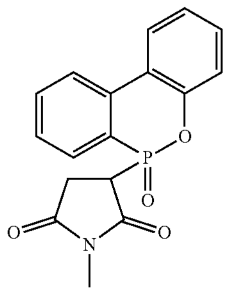

-continued (4)

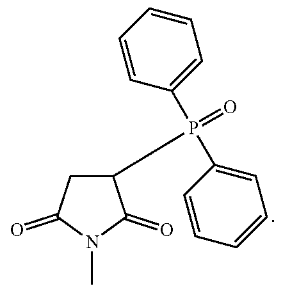

6. The resin composition according to claim 1, wherein the thermosetting resin (B) contains at least one selected from the group consisting of a polyphenylene ether compound, an allyl compound, an acrylate compound, a methacrylate compound, a vinyl compound, a styrenic compound, a maleimide compound (b1) different from the maleimide compound (a1), and a benzoxazine compound having an allyl group, each of which has two or more unsaturated double bonds.

7. The resin composition according to claim 1, comprising an inorganic filler.

8. A prepreg comprising:

the resin composition according to claim 1 or a semi-cured product of the resin composition; and a fibrous base material.

9. A film with resin comprising:

a resin layer containing the resin composition according to claim 1 or a semi-cured product of the resin composition; and a support film.

10. A metal foil with resin comprising:

a resin layer containing the resin composition according to claim 1 or a semi-cured product of the resin composition; and a metal foil.

11. A metal-clad laminate comprising:

an insulating layer containing a cured product of the resin composition according to claim 1; and a metal foil.

12. A metal-clad laminate comprising:

an insulating layer containing a cured product of the prepreg according to claim 8; and a metal foil.

13. A wiring board comprising:

an insulating layer containing a cured product of the resin composition according to claim 1; and a wiring.

14. A wiring board comprising:

an insulating layer containing a cured product of the prepreg according to claim 8; and a wiring.

* * * * *